United States Patent
Campbell et al.

(10) Patent No.: US 10,739,381 B2
(45) Date of Patent: Aug. 11, 2020

(54) COMPONENT ATTACHMENT TECHNIQUE USING A UV-CURE CONDUCTIVE ADHESIVE

(71) Applicant: Tektronix, Inc., Beaverton, OR (US)

(72) Inventors: Julie A. Campbell, Beaverton, OR (US); Regina R. Mrozik, Troutdale, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/978,090

(22) Filed: May 11, 2018

(65) Prior Publication Data

US 2018/0340956 A1 Nov. 29, 2018

Related U.S. Application Data

(60) Provisional application No. 62/635,526, filed on Feb. 26, 2018, provisional application No. 62/511,454, filed on May 26, 2017.

(51) Int. Cl.
*G01R 1/04* (2006.01)
*H05K 3/32* (2006.01)
(Continued)

(52) U.S. Cl.
CPC ........ *G01R 1/0416* (2013.01); *G01R 1/06755* (2013.01); *G01R 1/06788* (2013.01); *G01R 3/00* (2013.01); *H05K 3/321* (2013.01)

(58) Field of Classification Search
CPC .................................................. G01R 1/06755
See application file for complete search history.

(56) References Cited

U.S. PATENT DOCUMENTS 4,976,897 A * 12/1990 Callahan .............. B01D 69/125
210/490
4,999,136 A 3/1991 Su et al.
(Continued)

FOREIGN PATENT DOCUMENTS

WO WO/2014/205935 12/2014

OTHER PUBLICATIONS

H. J. James & F. M. Coughlan, An Overview of the Use of Electrically Conductive Adhesives (ECAs) as a Solder Replacement, Journal of Adhesion Science and Technology, Jan. 31 2008, pp. 801-813, vol. 22 No. 8-9, Utrecht : VNU Science Press, Netherlands.

(Continued)

*Primary Examiner* — Jas A Sanghera
(74) *Attorney, Agent, or Firm* — Miller Nash Graham & Dunn; Andrew J. Harrington

(57) ABSTRACT

A method of conductively bonding a test probe tip having an electrically conductive element to a device under test (DUT) having an electrical connection point, the method comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

22 Claims, 5 Drawing Sheets

(51) Int. Cl.
*G01R 1/067* (2006.01)
*G01R 3/00* (2006.01)

(56) References Cited

U.S. PATENT DOCUMENTS

| | | | |
|---|---|---|---|
| 5,366,573 A | 11/1994 | Bayer et al. | |
| 5,498,306 A * | 3/1996 | Shibata | B29C 65/1483 156/275.1 |
| 5,820,716 A | 10/1998 | Tuttle | |
| 6,043,670 A * | 3/2000 | Degani | G01R 31/2886 324/762.02 |
| 6,278,286 B1 | 8/2001 | Farnworth et al. | |
| 6,528,352 B1 * | 3/2003 | Jackson | G01R 1/0408 438/118 |
| 2002/0118032 A1 | 8/2002 | Norris et al. | |
| 2004/0239348 A1 * | 12/2004 | Barr | G01R 1/06711 324/754.02 |
| 2005/0085105 A1 | 4/2005 | Hanke et al. | |
| 2007/0013390 A1 | 1/2007 | Kuitani et al. | |
| 2008/0088327 A1 | 4/2008 | Kister | |
| 2008/0246501 A1 | 10/2008 | Williams | |
| 2009/0237099 A1 | 9/2009 | Garabedian et al. | |
| 2010/0102838 A1 * | 4/2010 | Kitazume | G01R 1/06727 324/756.03 |
| 2010/0176829 A1 | 7/2010 | Wada | |
| 2012/0274347 A1 | 11/2012 | Wang et al. | |
| 2012/0319710 A1 | 12/2012 | Dabrowiecki et al. | |
| 2013/0002280 A1 | 1/2013 | Nickel et al. | |
| 2013/0224417 A1 * | 8/2013 | Ogata | C08L 33/04 428/41.5 |
| 2014/0091818 A1 | 4/2014 | Chui | |
| 2014/0176176 A1 | 6/2014 | McGrath, Jr. | |
| 2014/0203802 A1 | 7/2014 | Fischer | |
| 2014/0306729 A1 | 10/2014 | Chen et al. | |
| 2014/0368229 A1 | 12/2014 | Arai et al. | |
| 2015/0168483 A1 * | 6/2015 | Kim | G01R 31/2886 324/754.08 |
| 2016/0341790 A1 | 11/2016 | Thompson et al. | |

OTHER PUBLICATIONS

Dymax Corporation, Electronics Assembly UV Light-Curable Adhesives, Coatings, Masking Resins, and Encapsulants for Electronic Assembly, Dymax Website, Jul. 21, 2016, pp. 1-16, URL: http://dymax.com/images/pdf/literature/lit019_electronic_adhesives_sg.pdf.

Keysight Technologies, Keysight N2800A Series Differential InfiniiMax III Probes User's Guide, Keysight Website, pp. 1-138, Feb. 28 2017, URL: http://literature.cdn.keysight.com/litweb/pdf/N2800-97019.pdf?id=2008310.

* cited by examiner

COMPONENT ATTACHMENT TECHNIQUE USING A UV-CURE CONDUCTIVE ADHESIVE

CROSS-REFERENCES TO RELATED APPLICATIONS

This patent application claims the benefit of provisional Application No. 62/635,526, filed Feb. 26, 2018, and the benefit of provisional Application No. 62/511,454, filed May 26, 2017. Each of those applications is incorporated in this patent application by this reference.

FIELD OF THE INVENTION

This disclosure is directed to systems and methods for electrically and mechanically connecting electronic components together using, instead of solder, an adhesive formulation cured by ultraviolet (UV) light, and, more particularly, to systems and methods for attaching a test probe to test points of a device under test with a UV-cure conductive adhesive.

BACKGROUND

Electrical devices, such as printed circuit boards, are often assessed by test and measurement equipment to provide information about the operation of the devices. This may be done, for example, during development, production, or simply when the devices are not working properly after manufacture. The test and measurement equipment may include meters, logic analyzers, and scopes such as oscilloscopes, as examples. The connection between the device under test (DUT) and the test and measurement equipment may be by way of a probe.

There are many ways to connect a test and measurement probe to a contact point on a device under test. One of the most popular conventional methods is to solder a probe tip, via generally short wires, directly to the metal contact on the DUT. This has been the standard for many years.

But soldering a probe tip onto a DUT can be challenging. For example, soldering requires a hot, and often large, solder iron tip. The high temperature required to melt the solder, generally over 700 degrees Fahrenheit (over 370 degrees Celsius) for lead-free solder, also has a tendency to burn or scorch portions of either the probe tip or the DUT during the soldering process. This temperature problem is exacerbated because the size of the solder iron tip is often larger than the desired test point on the DUT, such as a blind via, making it very difficult to apply the high heat from the soldering iron only to the desired test point. While a wire may be soldered between the probe tip and the DUT, the wire should be as short as possible for optimal electrical performance. But, when using conventional soldering techniques, the shorter the wire, the more difficult the solder attachment process is to perform. Furthermore, removal of a solder-in probe tip or rework of the solder joint is difficult. And these problems are magnified by the ever-shrinking geometries of the DUTs, including printed circuit boards that are now significantly smaller than a penny.

Embodiments of the disclosed systems and methods address these and other issues in the prior art.

DETAILED DESCRIPTION

As described herein, embodiments of the invention may help users, such as test engineers, temporarily attach test probes directly to test points of a device under test (DUT) using a conductive, UV-cure conductive adhesive. As used in this disclosure, the term "UV-cure conductive adhesive" may include UV-cure epoxies. Existing connection techniques typically use solder to temporarily attach a probe, or use a pressure contact, such as a browsing-style probe, to access signals from the DUT. The described embodiments, by contrast to soldering techniques, provide a quicker and easier attachment system that eliminates the high heat and the high skill required for conventional soldering techniques.

Figure 1:
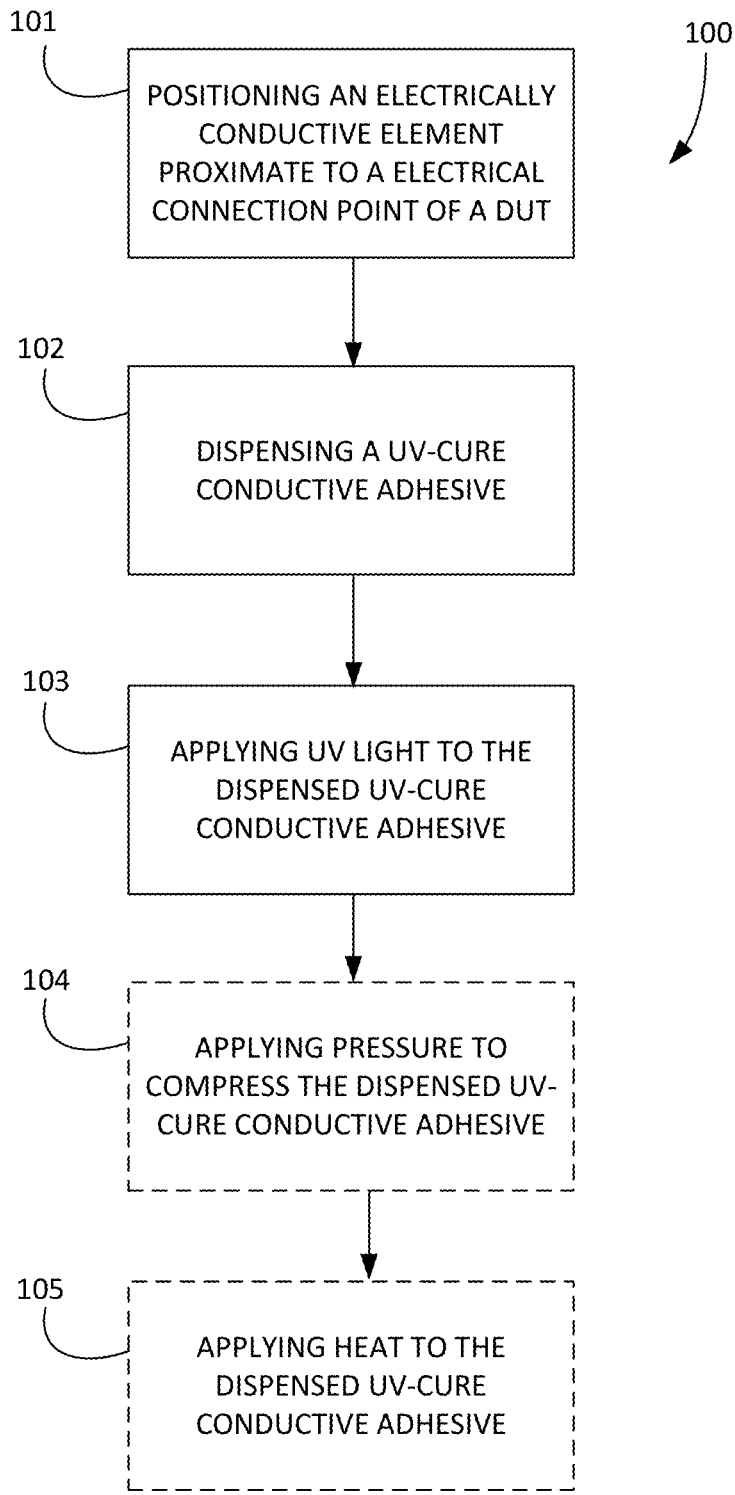
FIG. 1 is a flowchart showing an example method for using a UV-cure conductive adhesive, according to embodiments.

FIG. 1 is a flowchart showing a method for using a UV-cure conductive adhesive, according to embodiments of the disclosed technology. As illustrated in FIG. 1, a method 100 for bonding an electrically conductive element to a device under test (DUT) may include positioning 101 the electrically conductive element proximate to the electrical connection point of the DUT; dispensing 102 a UV-cure conductive adhesive between the electrically conductive element and the electrical connection point of the DUT; and bonding the dispensed UV-cure conductive adhesive to the electrically conductive element and the electrical connection point of the DUT by applying 103 UV-light from a UV-light source to the dispensed UV-cure conductive adhesive.

The electrically conductive element may be, for example, a spring, pad, via, trace, pin, connector contact, wire, or other conductive electrical contact point. Preferably, the electrically conductive element is part of, or is coupled to, a test probe tip.

As used in this disclosure, "positioning the electrically conductive element proximate to the electrical connection point of the DUT" means positioning the electrically conductive element so that the UV-cure conductive adhesive may create an electrical connection between the electrically conductive element and the electrical connection point of the DUT. In other words, the electrically conductive element may be touching the electrical connection point of the DUT. Or, if not touching, the electrically conductive element may be sufficiently close to the electrical connection point of the DUT so that the UV-cure conductive adhesive may electrically and structurally bridge the distance between the electrically conductive element and the electrical connection point of the DUT. To determine whether the proximity is sufficiently close, an operator may, for example, perform an electrical continuity test between the electrically conductive element and the electrical connection point of the DUT once the UV-cure conductive adhesive is cured.

The UV-cure conductive adhesive may be, for example, EMCAST 401 or EMCAST 501 electrically conductive epoxies, each provided by Electronic Materials Incorporated of Breckenridge, Colo. The UV-cure conductive adhesive may also be a z-axis-conducting UV-cure material. The z-axis-conducting UV-cure material preferably has a pressure vertical conductive bonding component that, while bonding mechanically in all directions, does not bond electrically in the cross axis (x and y) directions. Such a z-axis-conducting material allows tight contact-point alignment and selective vertical conduction, eliminating cross-connect to non-target electrical signals. Hence, for example, the UV-cure conductive adhesive may be ELECOLIT® 3065 anisotropically conductive adhesive provided by Panacol-Elosol GmbH.

In embodiments, the electrically conductive element or the electrical connection point on the DUT, or both, may be, or may include, tin, lead solder, lead-free solder, gold, silver, or copper. Conventional adhesives or epoxies may not adhere to those materials, particularly gold, silver, and copper. Accordingly, in such embodiments the UV-cure conductive adhesive preferably is an acrylic-based UV-cure conductive adhesive.

Preferably, the UV-cure conductive adhesive has a viscosity between about 15,000 centipoise and about 75,000 centipoise. The UV-cure conductive adhesive preferably uses silver as a conductive filler, in a proportion of approximately 75% filler material.

Preferably, the dispensed UV-cure conductive adhesive is continuously covering at least a portion of the electrically conductive element and at least a portion of the electrical connection point of the DUT. As noted, the UV-cure conductive adhesive preferably will electrically and structurally bridge the distance between the electrically conductive element and the electrical connection point of the DUT. Hence, "continuously" in the sense of "continuously covering" means spatially continuous in this disclosure.

Accordingly, the amount of the UV-cure conductive adhesive that is dispensed is at least the amount necessary to continuously cover at least a portion of the electrically conductive element and at least a portion of the electrical connection point of the DUT. To determine whether the amount is sufficient, an operator may, for example, perform an electrical continuity test between the electrically conductive element and the electrical connection point of the DUT once the UV-cure conductive adhesive is cured.

In embodiments, the dispensed UV-cure conductive adhesive also may be continuously covering at least a portion of a non-metallic area of the DUT. The non-metallic area may be, for example, FR4, MEGTRON® laminates provided by Panasonic Corporation, polytetrafluoroethylene (PTFE) laminates provided by Rogers Corporation, and other substrate materials used for a printed circuit board. As noted above, the DUT may be, or may include, a printed circuit board. An example is the DUT substrate 214 shown in FIGS. 2 and 5A-5C. Typically, the electrical connection point is embedded in or extends from the non-metallic area. In such embodiments, the dispensed UV-cure conductive adhesive is bonded to the electrically conductive element, the electrical connection point of the DUT, and the non-metallic area of the DUT by applying UV-light from a UV-light source to the dispensed UV-cure conductive adhesive. Conventional solder, by contrast, sticks only to certain metallic surfaces. Bonding the dispensed UV-cure conductive adhesive to the non-metallic area of the DUT helps to reduce the risk of pulling the electrical connection point off of the DUT, such as the pads, traces, and legs of a printed circuit board assembly.

The UV-light source may be, as examples, a hand-held, battery-powered, light-emitting diode (LED), such as a consumer-grade UV penlight, or a laboratory-grade UV spot lamp. In an example implementation, the UV-light may have a wavelength between about 365 nanometers and about 460 nanometers, and the UV-light from the UV-light source may be applied to the dispensed UV-cure conductive adhesive for a duration of between about twenty-five seconds and about thirty-five seconds. An operator may determine if the UV-light has been applied for a sufficient period by, for example, visually inspecting the dispensed UV-cure conductive adhesive. For example, UV-cure conductive adhesive that is uncured may have a shiny, whitish appearance while UV-cure conductive adhesive that is cured may have a dull, greyish appearance. As other examples, an operator may determine if the UV-light has been applied for a sufficient period by referencing a timer or a light-density meter on or connected to the UV-light source. The light-density meter might determine, for example, a shift from color to color of a phosphorescent material in the UV-cure conductive adhesive.

Figure 2:
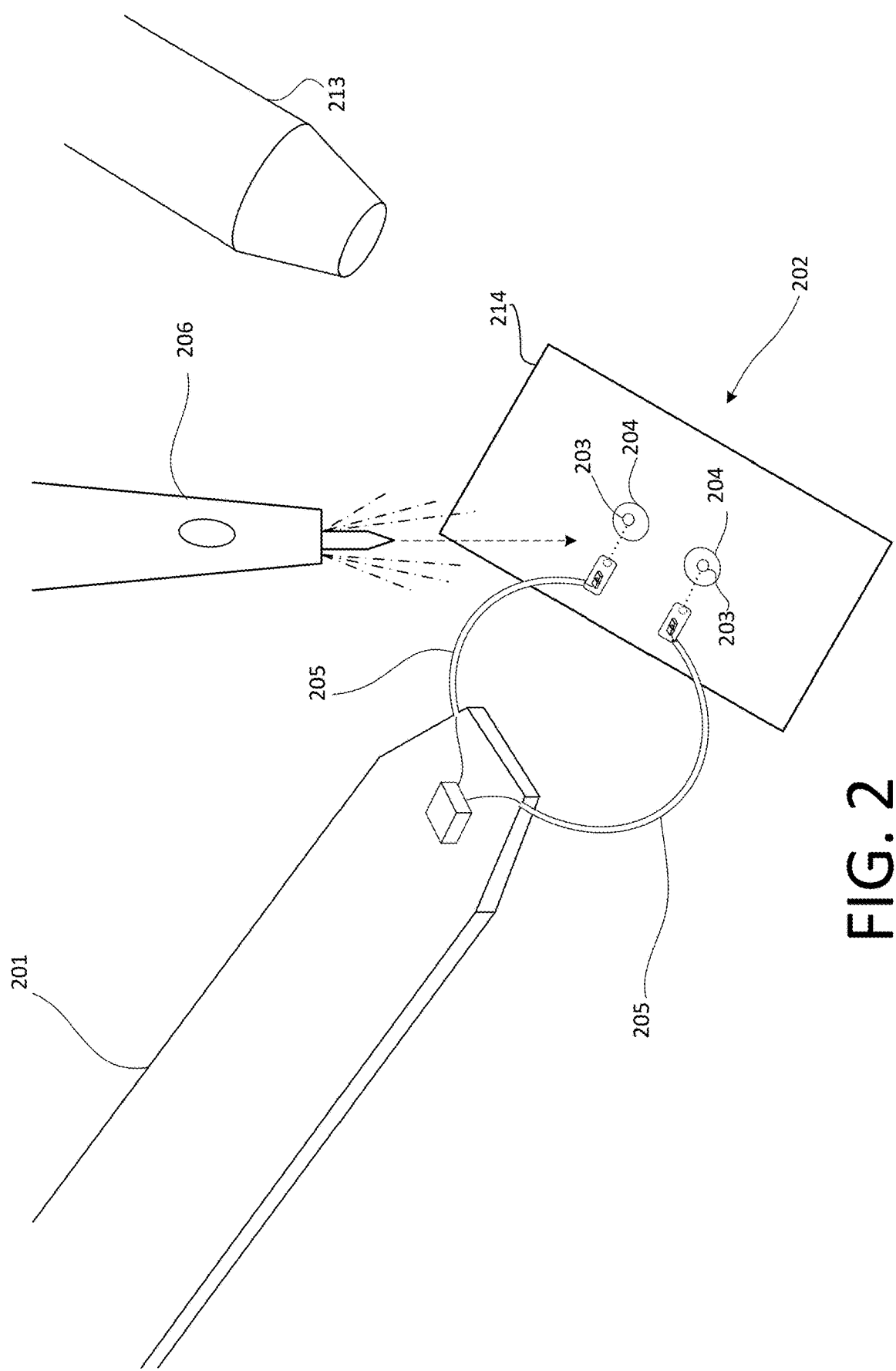
FIG. 2 shows an example setup for using a UV-cure conductive adhesive, according to embodiments.

FIG. 2 shows an example setup for using a UV-cure conductive adhesive according to embodiments of the disclosed technology. As illustrated in FIG. 2, a setup for using a UV-cure conductive adhesive to attach a test probe 201 to a DUT 202 may include, for example, placing a small drop of the UV-cure conductive adhesive 203 on a test point 204 of the DUT 202, placing an input wire, spring wire, or probe tip 205 of the test probe 201 into the adhesive 203, and applying UV light from a UV light source 206, and optionally applying heat from a heat source 213 or optionally applying pressure, to cure the UV-cure conductive adhesive 203, thus bonding the input wire, spring wire, or probe tip 205 to the test point 204 and providing an electrical connection between the test probe 201 and the DUT 202. The test point 204 may be a pad, via, trace, pin, connector contact, wire, or other conductive electrical contact point on the DUT 202. As noted above, the DUT 202 may be, or may include, a printed circuit board.

Returning to FIG. 1, the operation of bonding the dispensed UV-cure conductive adhesive may also include applying 104 pressure to the electrically conductive element and the electrical connection point of the DUT to compress the dispensed UV-cure conductive adhesive. Preferably, the pressure is applied during the operation of applying 103 UV-light from the UV-light source to the dispensed UV-cure conductive adhesive.

Figure 3:
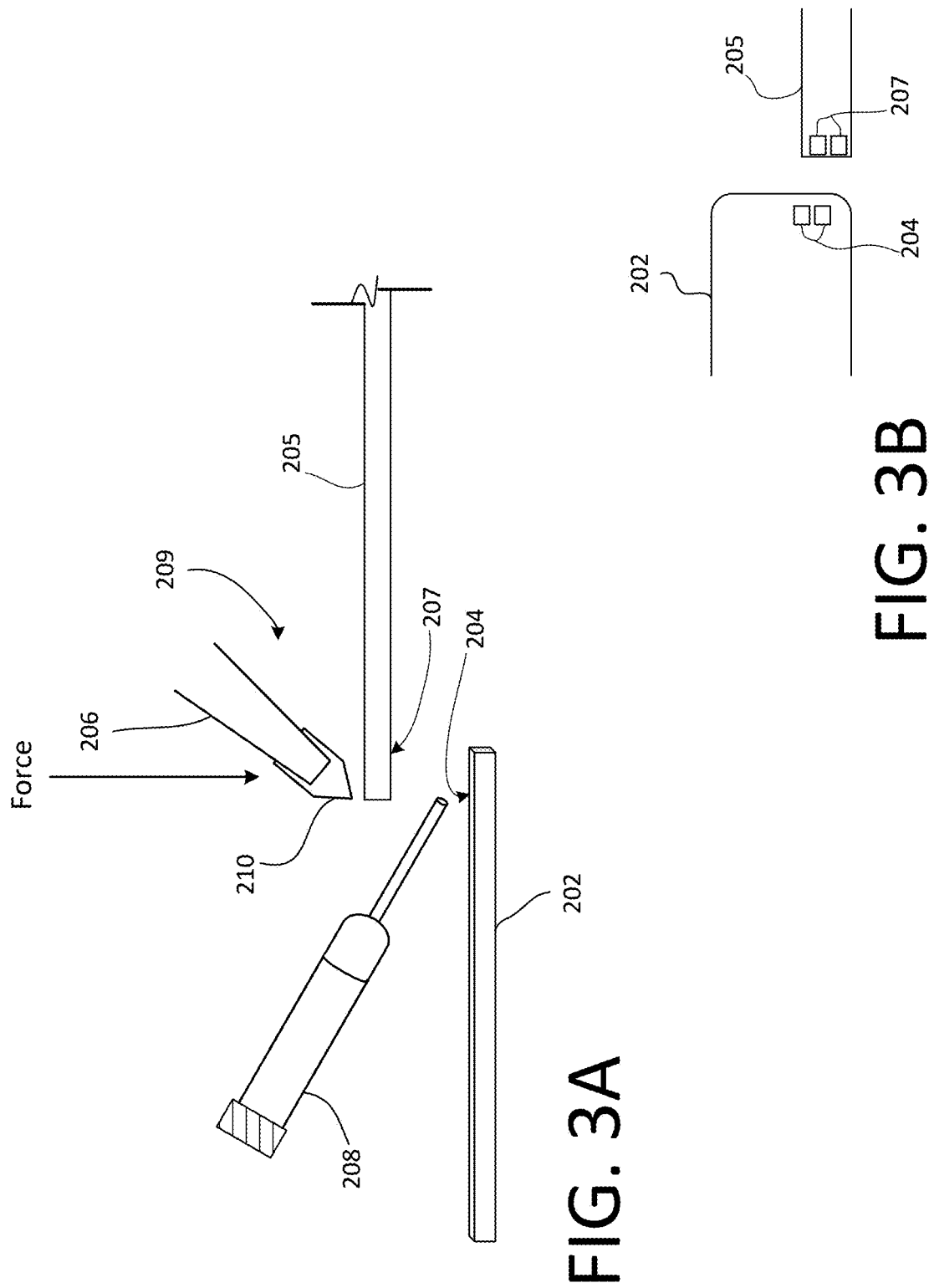
FIGS. 3A and 3B show an example of process of applying pressure to cure the UV-cure conductive adhesive, according to embodiments.

FIGS. 3A and 3B show an example process of applying pressure during the operation of curing the UV-cure conductive adhesive. FIG. 3B diagrammatically shows the topside of the DUT 202 and the underside of the probe tip 205 (where "topside" and "underside" are with reference to FIG. 3A), indicating representative locations of test points 204 on the DUT 202 and the corresponding points 207 on the underside of the probe tip 205. Each test point 204 of the DUT 202 and each test point 207 of the probe tip 205 may be a pad, via, trace, pin, connector contact, wire, or other conductive electrical contact point. As above, the test point 204 of the DUT 202 may be embedded in, or may extend from, a non-metallic area of the DUT 202. Likewise, the test point 207 of the probe tip 205 may be embedded in, or may extend from, a non-metallic area of the probe tip 205.

As illustrated in FIG. 3A, to apply pressure while providing UV light to cure the UV-cure conductive adhesive, an applicator 209 may include a UV light source 206 and a cone tip 210. The UV light source 206 may shine UV light through the cone tip 210, and the cone tip 210 may contact the probe tip 205 while the UV-cure conductive adhesive is being compressed between the probe tip 205 and the DUT 202. The cone tip 210 is formed from a material that will transmit the UV light. The cone tip 210 may be made from, for example, fluorinated ethylene propylene, such as the product provided under the name TEFLON® FEP by The Chemours Company FC, LLC, or PTFE provided under the name TEFLON® by The Chemours Company FC, LLC. The probe tip 205 may be made from a clear or translucent material to allow UV light from the UV light source 206 to pass through the probe tip 205 and illuminate the test points 204 of the DUT 202 and the test points 207 of the probe tip 205. Accordingly, the applicator 209 may apply UV light to cure the UV-cure conductive adhesive while also providing pressure through physical contact of the cone tip 210 to the probe tip 205 while the test points 204 of the DUT 202 and the test points 207 of the probe tip 205 are in the curing adhesive. FIG. 3A shows the UV-cure conductive adhesive as being applied to the test points 204 of the DUT 202 and the test points 207 of the probe tip 205 by a syringe 208, although the UV-cure conductive adhesive may be applied in any suitable fashion.

The implementation shown in FIGS. 3A and 3B is especially useful for embodiments in which the UV-cure conductive adhesive is a z-axis-conducting UV material. For example, the test points on the DUT and the corresponding points on the underside of the probe tip may be next to or nearby other, undesired points. The z-axis-conducting UV material, however, only allows conduction to occur on one axis—the axis between the test points on the DUT and the corresponding points on the probe tip—thus reducing or preventing shorts to adjacent, undesired points.

Returning to FIG. 1, the operation of bonding the dispensed UV-cure conductive adhesive may also include applying 105 heat from a heat source to the dispensed UV-cure conductive adhesive. Preferably, the heat is applied after the operation of applying 103 UV-light from the UV-light source to the dispensed UV-cure conductive adhesive. The heat source 213 (see FIG. 2) may be, for example, a conventional craft or hobby heat gun. In an example implementation, the heat may have a temperature less than about 200 degrees Celsius (about 390 degrees Fahrenheit), and the heat may be applied to the dispensed UV-cure conductive adhesive for a duration of between about twenty-five seconds and about thirty-five seconds. Preferably, the heat is applied to raise the temperature of the dispensed UV-cure conductive adhesive to about 100 degrees Celsius (about 210 degrees Fahrenheit) for about thirty seconds. Temperatures greater than about 200 degrees Celsius (about 390 degrees Fahrenheit) may thermally degrade DUTs having conventional substrates, such as FR4 substrates, if the heat is applied for periods of time that are substantially longer than the typical cure times of about sixty seconds or less.

Hence, the dispensed UV-cure conductive adhesive preferably may be bonded to the electrically conductive element and the electrical connection point of the DUT by (a) applying UV-light from the UV-light source to the dispensed UV-cure conductive adhesive without applying heat or pressure; (b) applying UV-light from the UV-light source and then heat from the heat source to the dispensed UV-cure conductive adhesive without applying pressure; or (c) applying UV-light from the UV-light source and simultaneously applying pressure to the dispensed UV-cure conductive adhesive without applying heat.

Figure 4:
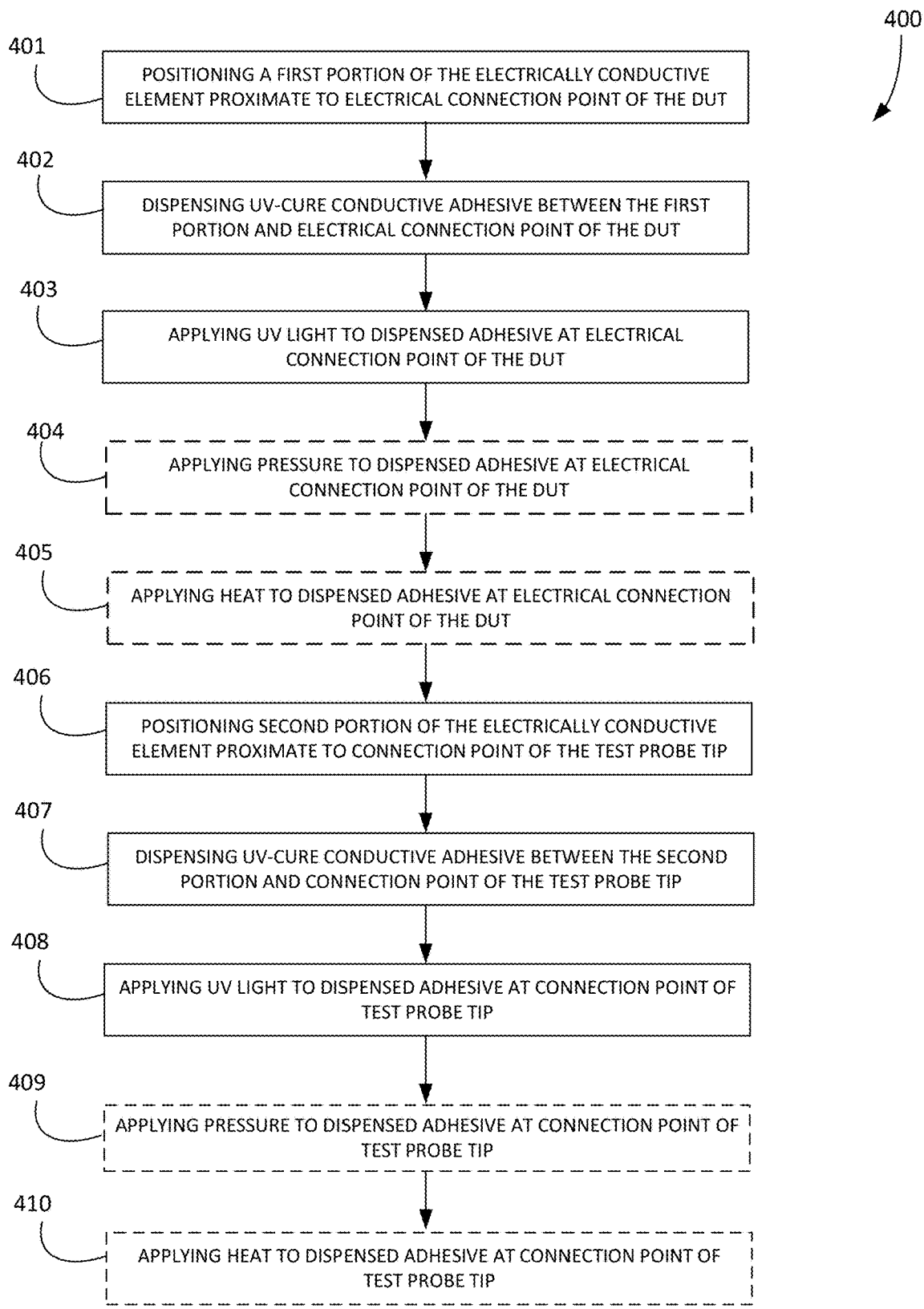
FIG. 4 is a flowchart showing another example method for using a UV-cure conductive adhesive, according to embodiments.

FIG. 4 is a flowchart showing a method for using a UV-cure conductive adhesive, according to embodiments of the disclosed technology. As illustrated in FIG. 4, a method 400 for bonding an electrically conductive element between an electrical connection point of a test probe tip and an electrical connection point of a device under test (DUT) may include positioning 401 a first portion of the electrically conductive element proximate to the electrical connection point of the DUT; dispensing 402 a first quantity of UV-cure conductive adhesive between the first portion of the electrically conductive element and the electrical connection point of the DUT; bonding the first quantity of dispensed UV-cure conductive adhesive to the first portion of the electrically conductive element and the electrical connection point of the DUT by applying 403 UV-light from a UV-light source to the first quantity of dispensed UV-cure conductive adhesive; positioning 406 a second portion of the electrically conductive element proximate to the electrical connection point of the test probe tip; dispensing 407 a second quantity of UV-cure conductive adhesive between the second portion of the electrically conductive element and the electrical connection point of the test probe tip; bonding the second quantity of dispensed UV-cure conductive adhesive to the second portion of the electrically conductive element and the electrical connection point of the test probe tip by applying 408 UV-light from a UV-light source to the second quantity of dispensed UV-cure conductive adhesive.

The first quantity of UV-cure conductive adhesive and the second quantity of UV-cure conductive adhesive may be the same amount of UV-cure conductive adhesive, or they may be different amounts.

The operation of bonding the first quantity of dispensed UV-cure conductive adhesive to the first portion of the electrically conductive element may also include applying 404 pressure to the first portion of the electrically conductive element and the electrical connection point of the DUT to compress the first quantity of dispensed UV-cure conductive adhesive during the operation of applying 403 UV-light from the UV-light source. Likewise, the operation of bonding the second quantity of dispensed UV-cure conductive adhesive to the second portion of the electrically conductive element may also include applying 409 pressure to the second portion of the electrically conductive element and the electrical connection point of the DUT to compress the second quantity of dispensed UV-cure conductive adhesive during the operation of applying 408 UV-light from the UV-light source.

The operation of bonding the first quantity of dispensed UV-cure conductive adhesive to the first portion of the electrically conductive element may also include applying 405 heat from a heat source to the first quantity of dispensed UV-cure conductive adhesive. Likewise, the operation of bonding the second quantity of dispensed UV-cure conductive adhesive to the second portion of the electrically conductive element may also include applying 410 heat from a heat source to the second quantity of dispensed UV-cure conductive adhesive.

The processes and materials in the method 400 of FIG. 4 are as described above for the similar processes and materials in the method 100 of FIG. 1, including the setups and options shown and described for FIGS. 2 and 4. It is noted that the first portion of the electrically conductive element may be, for example, a first end of a conductive wire. It is further noted that the second portion of the electrically conductive element may be, for example, a second end of the conductive wire, which is opposite the first end of the conductive wire.

As used in this disclosure, "positioning a first portion of the electrically conductive element proximate to the electrical connection point of the DUT" means positioning the first portion of the electrically conductive element so that the UV-cure conductive adhesive may create an electrical connection between the first portion of the electrically conductive element and the electrical connection point of the DUT. In other words, the first portion of the electrically conductive element may be touching the electrical connection point of the DUT. Or, if not touching, the first portion of the electrically conductive element may be sufficiently close to the electrical connection point of the DUT so that the UV-cure conductive adhesive may electrically and structurally bridge the distance between the first portion of the electrically conductive element and the electrical connection point of the DUT. To determine whether the proximity is sufficiently close, an operator may, for example, perform an electrical continuity test between the first portion of the electrically conductive element and the electrical connection point of the DUT once the UV-cure conductive adhesive is cured.

Likewise, as used in this disclosure, "positioning a second portion of the electrically conductive element proximate to the electrical connection point of the test probe tip" means positioning the second portion of the electrically conductive element so that the UV-cure conductive adhesive may create an electrical connection between the second portion of the electrically conductive element and the electrical connection point of the test probe tip. In other words, the second portion of the electrically conductive element may be touching the electrical connection point of the test probe tip. Or, if not touching, the second portion of the electrically conductive element may be sufficiently close to the electrical connection point of the test probe tip so that the UV-cure conductive adhesive may electrically and structurally bridge the distance between the second portion of the electrically conductive element and the electrical connection point of the test probe tip. To determine whether the proximity is sufficiently close, an operator may, for example, perform an electrical continuity test between the second portion of the electrically conductive element and the electrical connection point of the test probe tip once the UV-cure conductive adhesive is cured.

Preferably, the first quantity of dispensed of UV-cure conductive adhesive is continuously covering at least a portion of the first portion of the electrically conductive element and at least a portion of the electrical connection point of the DUT. Preferably, the second quantity of dispensed of UV-cure conductive adhesive is continuously covering at least a portion of the second portion of the electrically conductive element and at least a portion of the electrical connection point of the test probe tip. As for FIG. 1 above, therefore, "continuously" in the sense of "continuously covering" means spatially continuous in this disclosure.

Hence, for the method 400 of FIG. 4, the dispensed UV-cure conductive adhesive preferably may be bonded to the electrically conductive element and the electrical connection point of the DUT or the test probe tip, as applicable, by (a) applying UV-light from the UV-light source to the dispensed UV-cure conductive adhesive without applying heat or pressure; (b) applying UV-light from the UV-light source and then heat from the heat source to the dispensed UV-cure conductive adhesive without applying pressure; or (c) applying UV-light from the UV-light source and simultaneously applying pressure to the dispensed UV-cure conductive adhesive without applying heat.

Figure 5A:
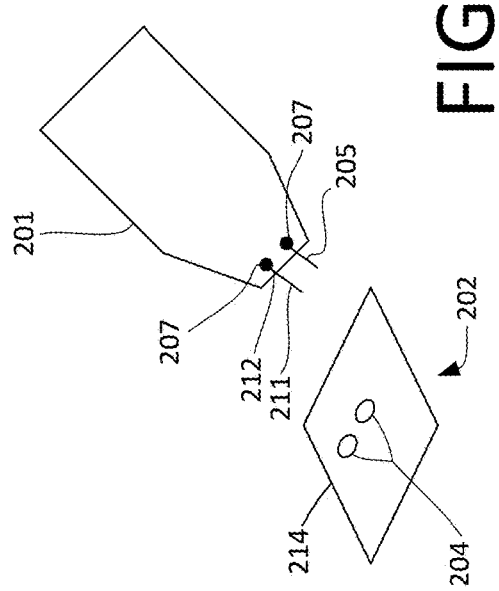
FIGS. 5A, 5B, and 5C show another example setup for using a UV-cure conductive adhesive, according to embodiments.
Figure 5C:
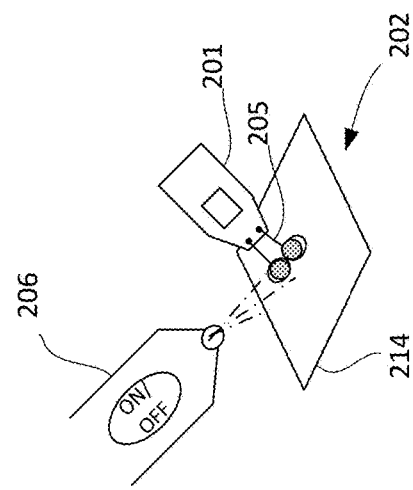
Figure 5B:
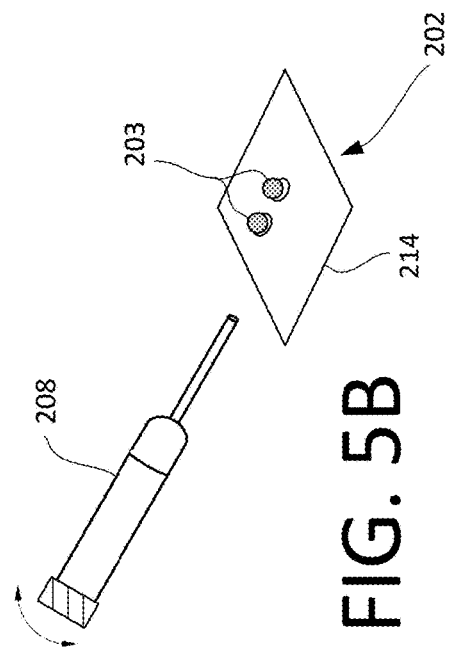

FIGS. 5A-5C shows an example setup for using a UV-cure conductive adhesive according to embodiments of the disclosed technology. As illustrated in FIGS. 5A-5C, a setup for using a UV-cure conductive adhesive to attach a test probe 201 to a DUT 202 may include, for example, placing a drop of the UV-cure conductive adhesive 203 on a test point 204 of the DUT 202, placing a distal end 211 of an input wire or probe tip 205 of the test probe 201 into the adhesive 203, and applying light from a light source 206, and perhaps pressure or heat, to cure the UV-cure conductive adhesive 203, thus bonding the distal end 211 of the input wire or probe tip 205 to the test point 204 and providing an electrical contact between the test probe 201 and the DUT 202.

In a corresponding fashion, a proximal end 212 of the input wire or probe tip 205 may be bonded to the test probe 201 through the test points 207 of the test probe 201.

Each test point 204 of the DUT 202 and each test point 207 of the probe tip 205 may be a pad, via, trace, pin, connector contact, wire, or other conductive electrical contact point. As above, the test point 204 of the DUT 202 may be embedded in, or may extend from, a non-metallic area of the DUT 202. Likewise, the test point 207 of the probe tip 205 may be embedded in, or may extend from, a non-metallic area of the probe tip 205.

While FIG. 5 shows the UV-cure conductive adhesive as being applied by a syringe 208, the UV-cure conductive adhesive may be applied in any suitable fashion.

In embodiments where the dispensed UV-cure conductive adhesive is bonded to the non-metallic area of the DUT, the UV-cure conductive adhesive preferably is an acrylic-based UV-cure conductive adhesive. Also, in embodiments where pressure is not applied to compress the dispensed UV-cure conductive adhesive (for example, embodiments lacking the operation 104 of FIG. 1 and embodiments lacking the operations 404 and 409 of FIG. 4), the UV-cure conductive adhesive preferably is an acrylic-based UV-cure conductive adhesive. Additionally, in embodiments where neither pressure nor heat is applied to the dispensed UV-cure conductive adhesive (for example, embodiments lacking the operations 104 and 105 of FIG. 1 and embodiments lacking the operations 404, 405, 409, and 410 of FIG. 4), the UV-cure conductive adhesive preferably is an acrylic-based UV-cure conductive adhesive. Preferably, the acrylic-based UV-cure conductive adhesive is a free radical UV reactive acrylate that incorporates an electrically conductive particulate that also has ancillary thermal conductive capabilities.

Hence, conventional soldering is not an effective way to bond test probes or other electronic components to the test points of a DUT when the DUT is quite small. That is, because of the heat involved, traditional solder techniques tend to ruin electronic components that are too close to the soldering iron, necessitating distance between the point of solder contact and the electronic components. This distance, however, and the variable geometry of the solder blob itself, add unpredictable parasitics that are difficult to correct with standard calibration and digital signal processing (DSP) techniques.

Embodiments described in this disclosure, though, provide some or all of the following advantages: (a) No 700-degree Fahrenheit soldering iron is required; (b) The UV-cure conductive adhesive is relatively quick to use when compared to conventional soldering techniques; (c) The UV-cure conductive adhesive adheres to FR4 and other circuit board substrate materials; (d) Easy clean-up: Prior to curing, the UV-cure conductive adhesive can be wiped away with isopropyl alcohol and a swab; (e) A user can position the probe tip near, rather than on, the DUT test point contact and bridge to the contact with the adhesive; (f) Easy removal/rework: Post curing, the adhesive can be removed with heat or with common solvents, preserving the DUT;

and (g) Repeatability of connections: UV cure adhesive can be successfully reapplied to the same test point.

For optimal electrical performance of a test probe, such as the test probe 201 in FIGS. 5A-5C, especially when the test probe 201 is being used to measure high frequency signals, it is desirable to minimize the electrical length between the test points 204 on the DUT and the test points 207 on the test probe 201; that is, to minimize the length of the wires or probe tips 205. As mentioned, the heat and skill required for conventional soldering attachment techniques tends in practice to force the length of wires 205 to be relatively long, thereby negatively impacting the performance of the test probe 201. In contrast, embodiments of the disclosed technology allow the length of wires 205 to be relatively short, thereby improving the performance of the test probe. Moreover, in some embodiments, the wires or probe tips 205 are integrated into and manufactured as part of the test probe 201, such as in the test probe 201 shown in FIG. 2. In these embodiments, the wires or probe tips 205 may be manufactured to a consistent and known length, allowing calibration to be performed on the test probe 201 all the way down to the distal end 211 of the probe tip 205 at the time of manufacture. With this extent of calibration, DSP techniques may be used to correct and remove electrical loading effects of the test probe 201 on the DUT, and provide a user with a more accurate measurement of the signal being measured.

Furthermore, electrical performance of a test probe 201 is also improved when the test probe 201 includes a resistive or impedance element as close as possible to the electrical connection point 104, 204 on the DUT. For example, the test probe 201 illustrated in FIG. 2 includes a small conventional resistor at the distal end of probe tips 205. However, in some embodiments of the disclosed technology, the UV-cure conductive adhesive is a resistive formulation. That is, in some embodiments, the UV-cure conductive adhesive is only partially conductive, and presents a resistance or impedance when measured across a dispensed quantity of the adhesive. Such a resistive formulation may contain, for example, a mix of silver and carbon as the conductive filler element, the relative proportions of these materials controlling the amount of resistance per unit volume of the adhesive. Thus, in these embodiments, the conventional resistor at the distal end of probe tips 205 may be eliminated, and the dispensed UV-cure conductive adhesive itself functions as the resistive element of the test probe 201, thereby further improving the electrical performance of the test probe 201, since the UV-cure conductive adhesive is directly touching the electrical connection point 104, 204 on the DUT.

EXAMPLES

Illustrative examples of the disclosed technologies are provided below. An embodiment of the technologies may include one or more, and any combination of, the examples described below.

Example 1 includes a method of conductively bonding a test probe tip having an electrically conductive element to a device under test (DUT) having an electrical connection point, the method comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 2 includes the method of Example 1, in which the operation of applying UV-light from a UV-light source to the dispensed UV-cure conductive adhesive comprises applying UV-light from a UV-light source to the dispensed UV-cure conductive adhesive for a duration of between about twenty-five seconds and about thirty-five seconds, the UV-light having a wavelength between about 365 nanometers and about 460 nanometers.

Example 3 includes the method of any of Examples 1-2, the operation of bonding the dispensed UV-cure conductive adhesive further comprising applying heat from a heat source to the dispensed UV-cure conductive adhesive.

Example 4 includes the method of Example 3, in which the operation of applying heat from a heat source to the dispensed UV-cure conductive adhesive comprises applying heat from a heat source to the dispensed UV-cure conductive adhesive for a duration of between about twenty-five seconds and about thirty-five seconds, the heat having a temperature less than about 200 degrees Celsius.

Example 5 includes the method of any of Examples 1-4, further comprising applying pressure to the electrically conductive element and the electrical connection point of the DUT to compress the dispensed UV-cure conductive adhesive during the operation of applying UV-light from the UV-light source.

Example 6 includes the method of any of Examples 1-5, in which the operation of dispensing a UV-cure conductive adhesive between the electrically conductive element and the electrical connection point of the DUT is: dispensing a z-axis-conducting UV-cure adhesive between the electrically conductive element and the electrical connection point of the DUT.

Example 7 includes the method of any of Examples 1-6, in which the operation of dispensing a UV-cure conductive adhesive between the electrically conductive element and the electrical connection point of the DUT is: dispensing a UV-cure conductive adhesive between the electrically conductive element and the electrical connection point of the DUT, the UV-cure conductive adhesive having a viscosity between about 50,000 centipoise and about 75,000 centipoise.

Example 8 includes the method of any of Examples 1-7, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is: bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

Example 9 includes the method of any of Examples 1-8, in which the operation of dispensing a UV-cure conductive adhesive between the electrically conductive element and the electrical connection point of the DUT is: dispensing an acrylic-based UV-cure conductive adhesive between the electrically conductive element and the electrical connection point of the DUT.

Example 10 includes a test probe tip, having an electrically conductive element, conductively bonded to a device under test (DUT), having an electrical connection point, by a process comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 11 includes the test probe tip bonded to a DUT of Example 10, in which the operation of dispensing a UV-cure conductive adhesive between the electrically conductive element and the electrical connection point of the DUT comprises: dispensing a z-axis-conducting UV-cure adhesive between the electrically conductive element and the electrical connection point of the DUT.

Example 12 includes the test probe tip bonded to a DUT of any of Examples 10-11, in which the operation of dispensing a UV-cure conductive adhesive between the electrically conductive element and the electrical connection point of the DUT comprises: dispensing an acrylic-based UV-cure conductive adhesive between the electrically conductive element and the electrical connection point of the DUT.

Example 13 includes the test probe tip bonded to a DUT of any of Examples 10-12, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is: bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

Example 14 includes the test probe tip bonded to a DUT of any of Examples 10-13, the process further comprising applying pressure to the electrically conductive element and the electrical connection point of the DUT to compress the dispensed UV-cure conductive adhesive during the operation of applying UV-light from the UV-light source.

Example 15 includes the test probe tip bonded to a DUT of any of Examples 10-14, in which the operation of dispensing a UV-cure conductive adhesive between the electrically conductive element and the electrical connection point of the DUT comprises: dispensing a UV-cure conductive adhesive between the electrically conductive element and the electrical connection point of the DUT, the UV-cure conductive adhesive having a viscosity between about 50,000 centipoise and about 75,000 centipoise.

Example 16 includes a method of conductively bonding a test probe tip to a device under test (DUT), the method comprising: positioning a first portion of an electrically conductive element proximate to an electrical connection point of the DUT; dispensing a first quantity of UV-cure conductive adhesive between the first portion of the electrically conductive element and the electrical connection point of the DUT, the dispensed first quantity of UV-cure conductive adhesive continuously covering at least a portion of the first portion of the electrically conductive element and at least a portion of the electrical connection point of the DUT; bonding the dispensed first quantity of UV-cure conductive adhesive to the first portion of the electrically conductive element and the electrical connection point of the DUT by applying UV-light from a UV-light source to the dispensed first quantity of UV-cure conductive adhesive; positioning a second portion of an electrically conductive element proximate to an electrical connection point of the test probe tip; dispensing a second quantity of UV-cure conductive adhesive between the second portion of the electrically conductive element and the electrical connection point of the test probe tip, the dispensed second quantity of UV-cure conductive adhesive continuously covering at least a portion of the second portion of the electrically conductive element and at least a portion of the electrical connection point of the test probe tip; and bonding the dispensed second quantity of UV-cure conductive adhesive to the second portion of the electrically conductive element and the electrical connection point of the test probe tip by applying UV-light from the UV-light source to the dispensed second quantity of UV-cure conductive adhesive.

Example 17 includes the method of Example 16, in which the operation of applying UV-light from a UV-light source to the dispensed first quantity of UV-cure conductive adhesive comprises applying UV-light from a UV-light source to the dispensed first quantity of UV-cure conductive adhesive for a duration of between about twenty-five seconds and about thirty-five seconds, the UV-light having a wavelength between about 365 nanometers and about 460 nanometers.

Example 18 includes the method of any of Examples 16-17, in which the operation of applying UV-light from a UV-light source to the dispensed second quantity of UV-cure conductive adhesive comprises applying UV-light from a UV-light source to the dispensed second quantity of UV-cure conductive adhesive for a duration of between about twenty-five seconds and about thirty-five seconds, the UV-light having a wavelength between about 365 nanometers and about 460 nanometers.

Example 19 includes the method of any of Examples 16-18, the operation of bonding the dispensed first quantity of UV-cure conductive adhesive further comprising applying heat from a heat source to the dispensed first quantity of UV-cure conductive adhesive.

Example 20 includes the method of Example 19, in which the operation of applying heat from a heat source to the first quantity of dispensed UV-cure conductive adhesive comprises applying heat from a heat source to the dispensed first quantity of UV-cure conductive adhesive for a duration of between about twenty-five seconds and about thirty-five seconds, the heat having a temperature less than about 200 degrees Celsius.

Example 21 includes the method of any of Examples 16-20, the operation of bonding the dispensed second quantity of UV-cure conductive adhesive further comprising applying heat from a heat source to the dispensed second quantity of UV-cure conductive adhesive.

Example 22 includes the method of Example 21, in which the operation of applying heat from a heat source to the second quantity of dispensed UV-cure conductive adhesive comprises applying heat from a heat source to the dispensed second quantity of UV-cure conductive adhesive for a duration of between about twenty-five seconds and about thirty-five seconds, the heat having a temperature less than about 200 degrees Celsius.

Example 23 includes the method of any of Examples 16-22, further comprising applying pressure to the first portion of the electrically conductive element and the electrical connection point of the DUT to compress the dispensed first quantity of UV-cure conductive adhesive during the operation of applying UV-light from the UV-light source.

Example 24 includes the method of any of Examples 16-23, further comprising applying pressure to the second portion of the electrically conductive element and the electrical connection point of the test probe tip to compress the dispensed second quantity of UV-cure conductive adhesive during the operation of applying UV-light from the UV-light source.

Example 25 includes the method of any of Examples 16-24, in which the operation of dispensing a first quantity of UV-cure conductive adhesive between the first portion of the electrically conductive element and the electrical connection point of the DUT is: dispensing a first quantity of z-axis-conducting UV-cure adhesive between the first portion of the electrically conductive element and the electrical connection point of the DUT.

Example 26 includes the method of any of Examples 16-25, in which the operation of dispensing a second quantity of UV-cure conductive adhesive between the second portion of the electrically conductive element and the electrical connection point of the test probe tip is: dispensing a second quantity of z-axis-conducting UV-cure adhesive between the second portion of the electrically conductive element and the electrical connection point of the test probe tip.

Example 27 includes the method of any of Examples 16-26, in which the operation of dispensing a first quantity of UV-cure conductive adhesive between the first portion of the electrically conductive element and the electrical connection point of the DUT is: dispensing a first quantity of UV-cure conductive adhesive between the first portion of the electrically conductive element and the electrical connection point of the DUT, the first quantity of UV-cure conductive adhesive having a viscosity between about 50,000 centipoise and about 75,000 centipoise.

Example 28 includes the method of any of Examples 16-27, in which the operation of dispensing a second quantity of UV-cure conductive adhesive between the second portion of the electrically conductive element and the electrical connection point of the test probe tip is: dispensing a second quantity of UV-cure conductive adhesive between the second portion of the electrically conductive element and the electrical connection point of the test probe tip, the second quantity of UV-cure conductive adhesive having a viscosity between about 50,000 centipoise and about 75,000 centipoise.

Example 29 includes the method of any of Examples 16-28, in which the dispensed first quantity of UV-cure conductive adhesive is also continuously covering at least a portion of a non-metallic area of the DUT, and in which the operation of bonding the dispensed first quantity of UV-cure conductive adhesive to the first portion of the electrically conductive element and the electrical connection point of the DUT by applying UV-light from a UV-light source to the dispensed first quantity of UV-cure conductive adhesive is: bonding the dispensed first quantity of UV-cure conductive adhesive to the first portion of the electrically conductive element, the electrical connection point of the DUT, and the non-metallic area of the DUT by applying UV-light from a UV-light source to the dispensed first quantity of UV-cure conductive adhesive.

Example 30 includes the method of any of Examples 16-29, in which the dispensed second quantity of UV-cure conductive adhesive is also continuously covering at least a portion of a non-metallic area of the test probe tip, and in which the operation of bonding the dispensed second quantity of UV-cure conductive adhesive to the second portion of the electrically conductive element and the electrical connection point of the test probe tip by applying UV-light from a UV-light source to the dispensed second quantity of UV-cure conductive adhesive is: bonding the dispensed second quantity of UV-cure conductive adhesive to the second portion of the electrically conductive element, the electrical connection point of the test probe tip, and the non-metallic area of the test probe tip by applying UV-light from a UV-light source to the dispensed second quantity of UV-cure conductive adhesive.

Example 31 includes the method of any of Examples 16-30, in which the operation of dispensing a first quantity of UV-cure conductive adhesive between the first portion of the electrically conductive element and the electrical connection point of the DUT is: dispensing a first quantity of acrylic-based UV-cure conductive adhesive between the first portion of the electrically conductive element and the electrical connection point of the DUT.

Example 32 includes the method of any of Examples 16-31, in which the operation of dispensing a second quantity of UV-cure conductive adhesive between the second portion of the electrically conductive element and the electrical connection point of the test probe tip is: dispensing a second quantity of acrylic-based UV-cure conductive adhesive between the second portion of the electrically conductive element and the electrical connection point of the test probe tip.

Example 33 includes a test system comprising: a test and measurement instrument; and a test probe tip, having an electrically conductive element, conductively bonded to a device under test (DUT), having an electrical connection point, by a process comprising: positioning the electrically conductive element of the test probe tip proximate to the electrical connection point of the DUT; dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and bonding the dispensed UV-cure conductive adhesive to the electrically conductive element and the electrical connection point of the DUT by applying UV-light from a UV-light source to the dispensed UV-cure conductive adhesive.

Example 34 includes the test system of Example 33, in which the test and measurement instrument is an oscilloscope.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure.

The invention claimed is:

1. A method of conductively bonding a test probe tip having an electrically conductive element to a device under test (DUT) having an electrical connection point, the method comprising:
    positioning the electrically conductive element of the test probe tip proximate to the electrical connection point of the DUT;
    dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and
    bonding the dispensed UV-cure conductive adhesive to the electrically conductive element and the electrical connection point of the DUT by applying UV-light from a UV-light source to the dispensed UV-cure conductive adhesive.

2. The method of claim 1, in which the operation of applying UV-light from a UV-light source to the dispensed UV-cure conductive adhesive comprises applying UV-light from a UV-light source to the dispensed UV-cure conductive adhesive for a duration of between about twenty-five seconds and about thirty-five seconds, the UV-light having a wavelength between about 365 nanometers and about 460 nanometers.

3. The method of claim 1, the operation of bonding the dispensed UV-cure conductive adhesive further comprising applying heat from a heat source to the dispensed UV-cure conductive adhesive.

4. The method of claim 3, in which the operation of applying heat from a heat source to the dispensed UV-cure conductive adhesive comprises applying heat from a heat source to the dispensed UV-cure conductive adhesive for a duration of between about twenty-five seconds and about thirty-five seconds, the heat having a temperature less than about 200 degrees Celsius.

5. The method of claim 1, further comprising applying pressure to the electrically conductive element and the electrical connection point of the DUT to compress the dispensed UV-cure conductive adhesive during the operation of applying UV-light from the UV-light source.

6. The method of claim 1, in which the operation of dispensing a UV-cure conductive adhesive between the electrically conductive element and the electrical connection point of the DUT is:
    dispensing a z-axis-conducting UV-cure adhesive between the electrically conductive element and the electrical connection point of the DUT.

7. The method of claim 1, in which the operation of dispensing a UV-cure conductive adhesive between the electrically conductive element and the electrical connection point of the DUT is:
    dispensing a UV-cure conductive adhesive between the electrically conductive element and the electrical connection point of the DUT, the UV-cure conductive adhesive having a viscosity between about 50,000 centipoise and about 75,000 centipoise.

8. The method of claim 1, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is:
    bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

9. The method of claim 1, in which the operation of dispensing a UV-cure conductive adhesive between the electrically conductive element and the electrical connection point of the DUT is:
    dispensing an acrylic-based UV-cure conductive adhesive between the electrically conductive element and the electrical connection point of the DUT.

10. A test probe tip, having an electrically conductive element, conductively bonded to a device under test (DUT), having an electrical connection point, by a process comprising:
    positioning the electrically conductive element of the test probe tip proximate to the electrical connection point of the DUT;
    dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and
    bonding the dispensed UV-cure conductive adhesive to the electrically conductive element and the electrical connection point of the DUT by applying UV-light from a UV-light source to the dispensed UV-cure conductive adhesive.

11. The test probe tip bonded to a DUT of claim 10, in which the operation of dispensing a UV-cure conductive adhesive between the electrically conductive element and the electrical connection point of the DUT comprises:
    dispensing a z-axis-conducting UV-cure adhesive between the electrically conductive element and the electrical connection point of the DUT.

12. The test probe tip bonded to a DUT of claim 10, in which the operation of dispensing a UV-cure conductive adhesive between the electrically conductive element and the electrical connection point of the DUT comprises:
    dispensing an acrylic-based UV-cure conductive adhesive between the electrically conductive element and the electrical connection point of the DUT.

13. The test probe tip bonded to a DUT of claim 10, in which the dispensed UV-cure conductive adhesive is also continuously covering at least a portion of a non-metallic area of the DUT, and in which the operation of bonding the dispensed UV-cure conductive adhesive to the electrically conductive element and the electrical connection point of the DUT by applying UV-light from a UV-light source to the dispensed UV-cure conductive adhesive is:

bonding the dispensed UV-cure conductive adhesive to the electrically conductive element, the electrical connection point of the DUT, and the non-metallic area of the DUT by applying UV-light from a UV-light source to the dispensed UV-cure conductive adhesive.

14. The test probe tip bonded to a DUT of claim 10, the process further comprising applying pressure to the electrically conductive element and the electrical connection point of the DUT to compress the dispensed UV-cure conductive adhesive during the operation of applying UV-light from the UV-light source.

15. The test probe tip bonded to a DUT of claim 10, in which the operation of dispensing a UV-cure conductive adhesive between the electrically conductive element and the electrical connection point of the DUT comprises:
dispensing a UV-cure conductive adhesive between the electrically conductive element and the electrical connection point of the DUT, the UV-cure conductive adhesive having a viscosity between about 50,000 centipoise and about 75,000 centipoise.

16. A method of conductively bonding a test probe tip to a device under test (DUT), the method comprising:
positioning a first portion of an electrically conductive element proximate to an electrical connection point of the DUT;
dispensing a first quantity of UV-cure conductive adhesive between the first portion of the electrically conductive element and the electrical connection point of the DUT, the dispensed first quantity of UV-cure conductive adhesive continuously covering at least a portion of the first portion of the electrically conductive element and at least a portion of the electrical connection point of the DUT;
bonding the dispensed first quantity of UV-cure conductive adhesive to the first portion of the electrically conductive element and the electrical connection point of the DUT by applying UV-light from a UV-light source to the dispensed first quantity of UV-cure conductive adhesive;
positioning a second portion of the electrically conductive element proximate to an electrical connection point of the test probe tip;
dispensing a second quantity of UV-cure conductive adhesive between the second portion of the electrically conductive element and the electrical connection point of the test probe tip, the dispensed second quantity of UV-cure conductive adhesive continuously covering at least a portion of the second portion of the electrically conductive element and at least a portion of the electrical connection point of the test probe tip; and
bonding the dispensed second quantity of UV-cure conductive adhesive to the second portion of the electrically conductive element and the electrical connection point of the test probe tip by applying UV-light from the UV-light source to the dispensed second quantity of UV-cure conductive adhesive.

17. The method of claim 16, in which the dispensed first quantity of UV-cure conductive adhesive is also continuously covering at least a portion of a non-metallic area of the DUT, and in which the operation of bonding the dispensed first quantity of UV-cure conductive adhesive to the first portion of the electrically conductive element and the electrical connection point of the DUT by applying UV-light from a UV-light source to the dispensed first quantity of UV-cure conductive adhesive is:
bonding the dispensed first quantity of UV-cure conductive adhesive to the first portion of the electrically conductive element, the electrical connection point of the DUT, and the non-metallic area of the DUT by applying UV-light from a UV-light source to the dispensed first quantity of UV-cure conductive adhesive.

18. The method of claim 16, in which the dispensed second quantity of UV-cure conductive adhesive is also continuously covering at least a portion of a non-metallic area of the test probe tip, and in which the operation of bonding the dispensed second quantity of UV-cure conductive adhesive to the second portion of the electrically conductive element and the electrical connection point of the test probe tip by applying UV-light from a UV-light source to the dispensed second quantity of UV-cure conductive adhesive is:
bonding the dispensed second quantity of UV-cure conductive adhesive to the second portion of the electrically conductive element, the electrical connection point of the test probe tip, and the non-metallic area of the test probe tip by applying UV-light from a UV-light source to the dispensed second quantity of UV-cure conductive adhesive.

19. The method of claim 16, in which the operation of dispensing a first quantity of UV-cure conductive adhesive between the first portion of the electrically conductive element and the electrical connection point of the DUT is:
dispensing a first quantity of acrylic-based UV-cure conductive adhesive between the first portion of the electrically conductive element and the electrical connection point of the DUT.

20. The method of claim 16, in which the operation of dispensing a second quantity of UV-cure conductive adhesive between the second portion of the electrically conductive element and the electrical connection point of the test probe tip is:
dispensing a second quantity of acrylic-based UV-cure conductive adhesive between the second portion of the electrically conductive element and the electrical connection point of the test probe tip.

21. A test system comprising:
a test and measurement instrument; and
a test probe tip, having an electrically conductive element, conductively bonded to a device under test (DUT), having an electrical connection point, by a process comprising:
positioning the electrically conductive element of the test probe tip proximate to the electrical connection point of the DUT;
dispensing a UV-cure conductive adhesive between the electrically conductive element and the electrical connection point of the DUT, the dispensed UV-cure conductive adhesive continuously covering at least a portion of the electrically conductive element and at least a portion of the electrical connection point of the DUT; and
bonding the dispensed UV-cure conductive adhesive to the electrically conductive element and the electrical connection point of the DUT by applying UV-light from a UV-light source to the dispensed UV-cure conductive adhesive.

22. The test system of claim 21, in which the test and measurement instrument is an oscilloscope.

* * * * *